United States Patent
Arai et al.

(10) Patent No.: US 7,382,204 B2
(45) Date of Patent: Jun. 3, 2008

(54) CONSTANT TEMPERATURE CRYSTAL OSCILLATOR

(75) Inventors: Junichi Arai, Sayama (JP); Naoki Sekine, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 130 days.

(21) Appl. No.: 11/384,556

(22) Filed: Mar. 20, 2006

(65) Prior Publication Data

US 2006/0214743 A1   Sep. 28, 2006

(30) Foreign Application Priority Data

Mar. 28, 2005  (JP) ............................. 2005-092067
Jan. 31, 2006  (JP) ............................. 2006-023865

(51) Int. Cl.
  *H03B 5/32*  (2006.01)
(52) U.S. Cl. ........................................ 331/69; 331/176
(58) Field of Classification Search ................ 331/158, 331/176, 69, 66
See application file for complete search history.

(56) References Cited

U.S. PATENT DOCUMENTS

| | | | |
|---|---|---|---|
| 6,362,700 B1 | 3/2002 | Fry | |
| 6,433,309 B2 | 8/2002 | Hashimoto et al. | |
| 2001/0040154 A1 | 11/2001 | Hashimoto et al. | |
| 2005/0258913 A1* | 11/2005 | Ito et al. ................... | 331/158 |

2006/0267702 A1   11/2006  Neumann

FOREIGN PATENT DOCUMENTS

| | | |
|---|---|---|
| JP | 59149406 | 8/1984 |
| JP | 2005341191 A | 8/2005 |
| WO | WO 2004/091100 | 10/2004 |

OTHER PUBLICATIONS

European Search Report for application No. 06240033.1, dated May 7, 2007 (7 pages).

* cited by examiner

*Primary Examiner*—Joseph Chang
(74) *Attorney, Agent, or Firm*—Schwegman, Lundberg & Woessner P.A.

(57) ABSTRACT

A constant temperature crystal oscillator includes on a circuit substrate: a surface-mount crystal resonator which is provided with two crystal terminals as mount terminals and a dummy terminal on the bottom surface, and has a metal cover; an oscillation circuit element which forms an oscillation circuit together with the crystal resonator; and a temperature control element which keeps a constant operation temperature of the crystal resonator, in which the temperature control element includes at least a heating chip resistor, a power transistor for supplying electric power to the chip resistor, and a temperature sensitive resistor for detecting the operation temperature of the crystal resonator, wherein a dummy terminal on the substrate side of the circuit substrate for connection to the dummy terminal of the crystal resonator is connected to a resistor terminal on the substrate side to which the temperature sensitive resistor is connected through a conductive path.

20 Claims, 6 Drawing Sheets

CONSTANT TEMPERATURE CRYSTAL OSCILLATOR

This application claims priority under 35 U.S.C. 119 to Japanese Application No. 2005-092067, filed Mar. 28, 2005 and Japanese Application No. 2006-023865, filed Jan. 31, 2006, which applications are incorporated herein by reference and made a part hereof.

BACKGROUND OF THE INVENTION

1. Field of the Invention

The present invention relates to a constant temperature crystal oscillator (hereinafter referred to as a constant temperature oscillator) using a surface-mount crystal resonator (hereinafter referred to as a surface-mount resonator), and more specifically to a constant temperature oscillator which excels in response characteristic to a temperature change.

2. Description of the Related Art

Generally, a constant temperature oven has been used for a constant temperature oscillator. Since the operation temperature of a crystal resonator can be kept constant, the frequency stability is high (the frequency deviation is approximately 0.05 ppm or lower). For example, it is used for the communication facilities of a base station for optical communications, etc. Recently, these communication facilities have become downsized. In this connection, a surface-mount resonator has been widely adopted. The Applicant of the present invention has disclosed one of these facilities (Japanese Patent Application No. 2004-157072).

Figure 1A:
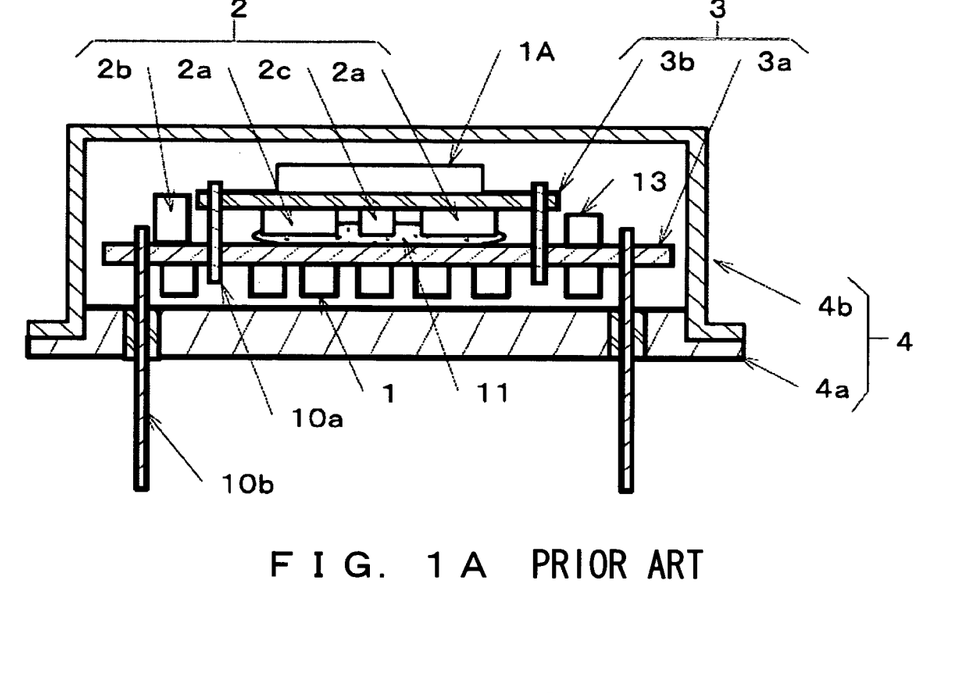
FIG. 1A is a sectional view of the constant temperature oscillator.
Figure 1B:
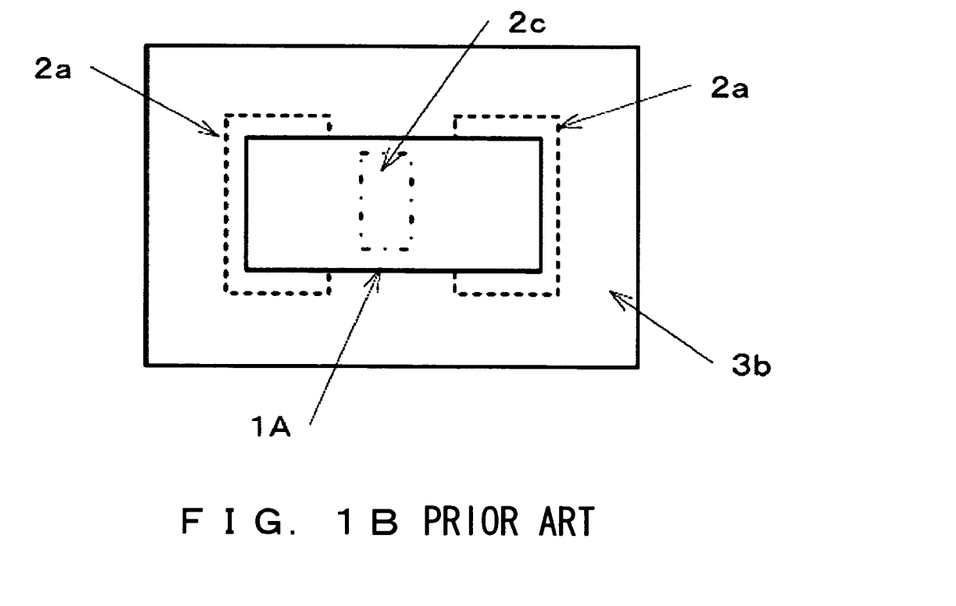
FIG. 1B is a plan view of the second substrate.
Figure 2A:
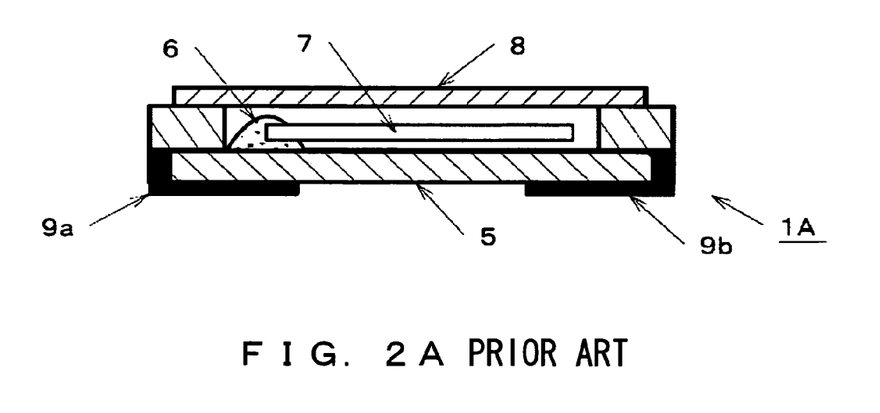
FIG. 2A is a sectional view.
Figure 2B:
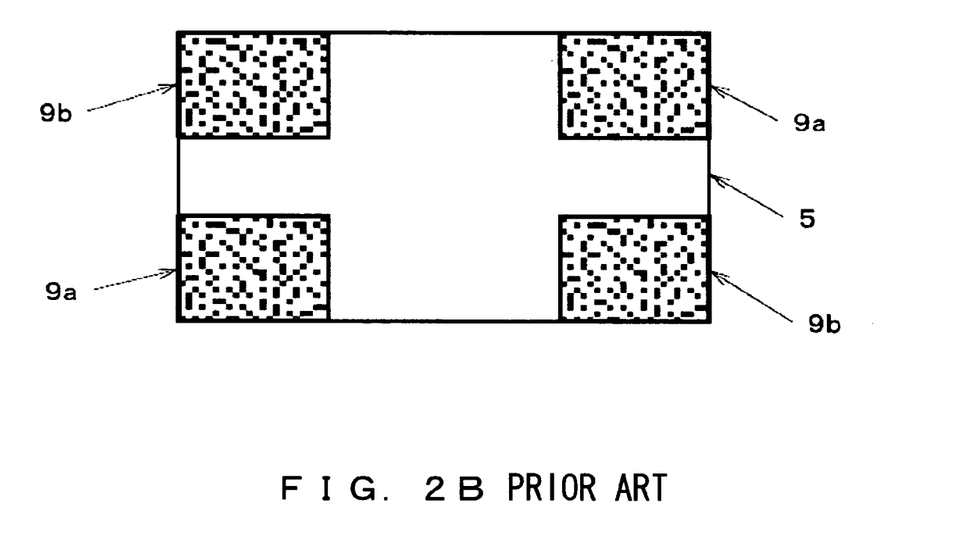
FIG. 2B is a bottom view.

FIGS. 1A, 1B, 2A, and 2B are explanatory views showing a related art. FIG. 1A is a sectional view of a constant temperature oscillator. FIG. 1B is a plan view of the first substrate. FIG. 2A is a sectional view of a surface-mount resonator. FIG. 2B is a bottom view.

The constant temperature oscillator has a surface-mount resonator 1A, an oscillation circuit element 1 for forming an oscillation circuit together with the resonator, and a temperature control element 2 for keeping a constant operation temperature of the surface-mount resonator 1A arranged on a circuit substrate 3, and these components are airtightly sealed in a metal container 4. The surface-mount resonator 1A fixes a crystal element 7 using a conductive adhesive 6 on the inside bottom portion of a concave ceramic container body 5, a metal cover 8 is used as a cover and airtightly seals the entire structure.

At the four corners of the outside bottom portion (reverse side) of the container body 5, crystal terminals 9a and dummy terminals 9b are provided as mount terminals for a set substrate of a wireless equipment, etc. The crystal terminals 9a (two terminals) are provided at a set of diagonal portions, and connected to an excitation electrode (not shown in the attached drawings) of the crystal element. The dummy terminals 9b (two terminals) are provided at the other diagonal portions, and are normally connected to the metal cover 8 using a via hole, etc. (not shown in the attached drawings), and function as, for example, grounding terminals connected to a grounding pattern (not shown in the attached drawings) of the substrate.

The temperature control element 2 keeps the constant operation temperature of the surface-mount resonator 1A, and includes at least a heating chip resistor 2a (for example, two resistors), a power transistor 2b for supplying power to the resistors, and a temperature sensitive resistor 2c for detecting the operation temperature of the surface-mount resonator 1A. The temperature sensitive resistor 2c is assumed to be a thermistor indicating a decreasing resistance value with an increasing temperature. The power transistor 2b provides the power controlled by the resistance value based on the temperature of the temperature sensitive resistor 2c for the heating chip resistor 2a. Thus, the operation temperature of the surface-mount resonator 1A is kept constant.

The circuit substrate circuit substrate 3 includes a first substrate 3a and a second substrate 3b, and the second substrate 3b is held by a metal pin 10a on the first substrate 3a. The first substrate 3a is made of a glass epoxy material, and the oscillation circuit element 1 excluding the surface-mount resonator 1A is arranged on the bottom surface. The second substrate 3b is made of a ceramic material, and has the crystal resonator 1A arranged on the top surface, and has the chip resistor 2a and the temperature sensitive resistor 2c excluding the power transistor 2b in the temperature control element 2 arranged on the bottom surface.

Between the first substrate 3a and the second substrate 3b, a silicon base thermal conductive resin 11 is applied for covering the chip resistor 2a and the temperature sensitive resistor 2c. Since the power transistor 2b is long in height, it is arranged on the terminal side of the first substrate 3a. The metal container 4 is formed by a metal base 4a and a cover 4b. An airtight terminal 10b of the metal base 4a holds the first substrate 3a, and the cover 4b airtightly sealed by resistance welding. The dummy terminal 9b as a grounding terminal of the crystal resonator 1A is connected to the airtight terminal 10b for grounding through the conductive path (grounding pattern) not shown in the attached drawings and the metal pin 10a.

Figure 3A:
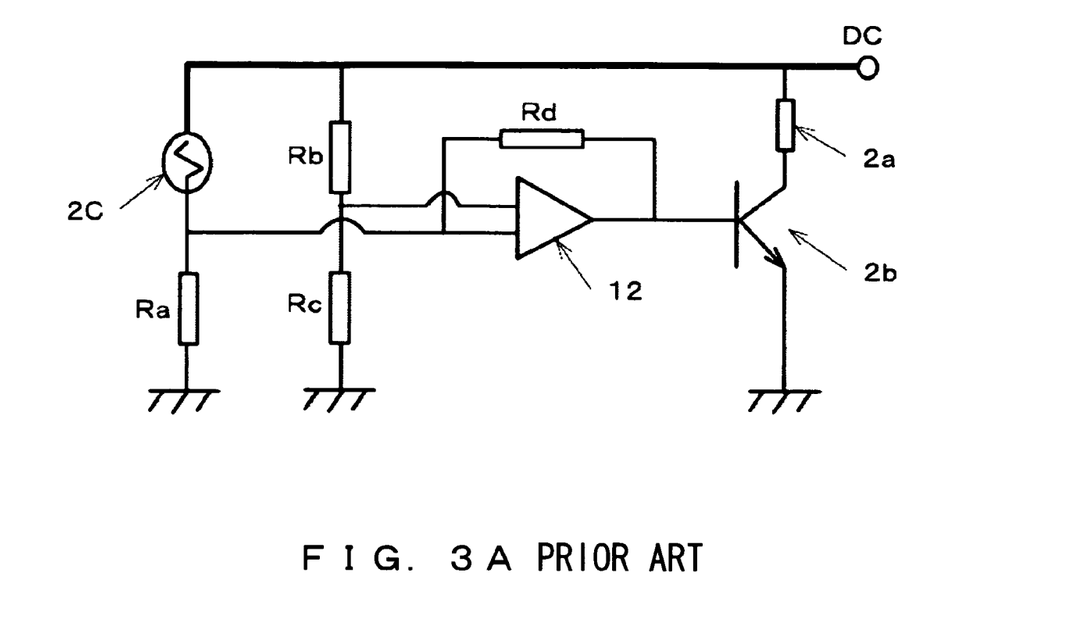
FIG. 3A shows the temperature control circuit diagram of the constant temperature.

In this example, electric power is supplied to the heating chip resistor 2a by, for example, a well-known temperature control circuit shown in FIG. 3A. That is, a temperature sensitive voltage by the temperature sensitive resistor 2c and a resistor Ra is applied to one input terminal of an operational amplifier 12, and a reference voltage by resistors Rb and Rc is applied to the other input terminal. Then, the reference temperature difference voltage from the reference voltage is applied to the base of the power transistor 2b, and electric power is supplied from the direct current voltage DC to the heating chip resistor 2a. Thus, the electric power to the heating chip resistor 2a can be controlled by the resistance value depending on the temperature of the temperature sensitive resistor 2c.

Figure 3B:
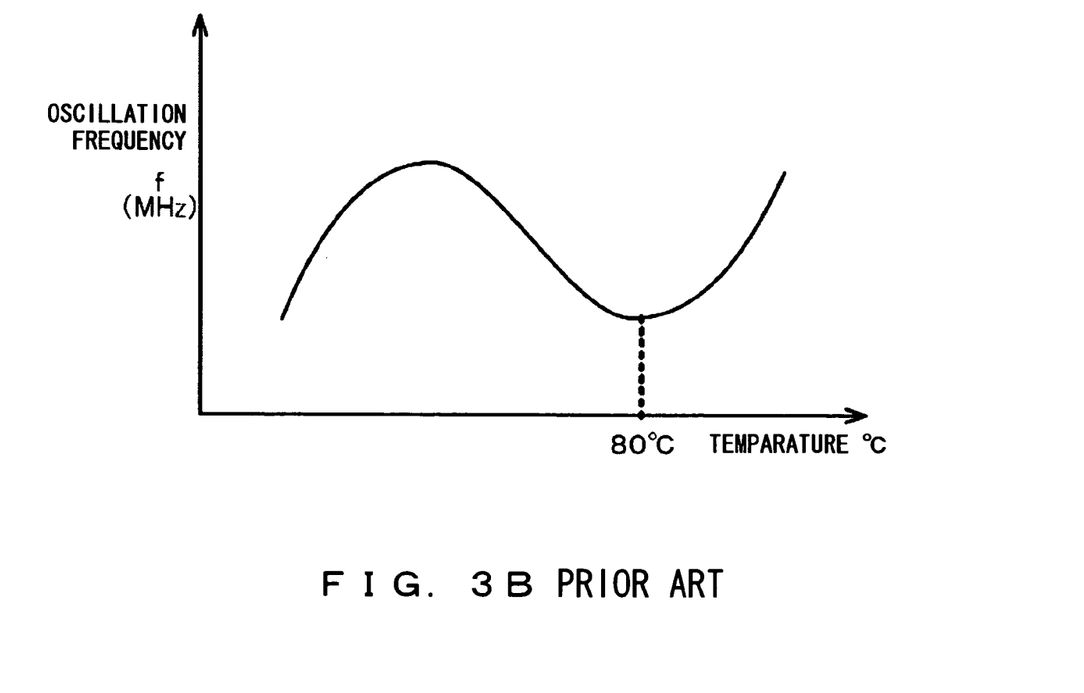
FIG. 3B shows the frequency temperature characteristic of the surface-mount resonator.

Normally, before connecting the metal cover 4b by setting the first and second circuit substrates 3a and 3b to the metal base 4a, for example, the frequency temperature characteristic as the cubic curve shown in FIG. 3B of the surface-mount resonator 1A as, for example, AT cut is individually measured. When the temperature as the minimum value at the high temperature side of the operation temperature of the surface-mount resonator 1A is, for example, 80° C., the resistor Ra of the temperature control circuit is controlled and the surface-mount resonator 1A is set to 80° C. Then, the control capacitor (not shown in the attached drawings) of the oscillation circuit matches the oscillation frequency f with the nominal frequency. Thus, the resistor Ra and the control elements 13 which require exchange such as the control capacitor, etc. are arranged on the perimeter of the first substrate 3a horizontally projecting from the second substrate 3b (FIG. 1).

With the above-mentioned configuration, the conventional constant temperature oven not shown in the attached drawings is not used, and the heating chip resistor 2a is used as a heat source. Therefore, the entire system can be basically downsized. Then, the second substrate 3b having the surface-mount resonator 1A, the chip resistor 2a, and the temperature sensitive resistor 2c is a highly thermal conductive ceramic material. These components are covered with a thermal conductive resin. Therefore, the operation temperature of the surface-mount resonator 1A can be directly detected by the temperature sensitive resistor 2c, and the response characteristic to a temperature change can be improved.

However, in the constant temperature oscillator with the above-mentioned configuration, although the surface-mount resonator 1A and the temperature sensitive resistor 2c are arranged on both main surface sides of the second substrate 3b which is made of a highly thermal conductive ceramic material, the thermal conductivity is low (poor thermal conductivity) as compared with copper (Cu), gold (Au), etc. as a wiring pattern, for example. Therefore, since the resistance value of the temperature sensitive resistor is not immediately changed in synchronization with the operation temperature of the surface-mount resonator, and the operation temperature cannot be detected in real time, there has been the problem that the response characteristic to an ambient temperature is poor.

Since the first substrate 3a and the second substrate 3b are arranged up and down by the metal pin 10a, the number of production processes can be increased and the height is increased. Furthermore, since the second substrate 3b is made of a ceramic material, it is more expensive than a substrate of a glass epoxy material. In addition, since the power transistor 2b of the temperature control element 2 is long in height, it is arranged on the first substrate 3a aside from the second substrate 3b on which the chip resistor 2a is arranged. Therefore, the liberated heat from the power transistor 2b can be prevented from being effectively used.

SUMMARY OF THE INVENTION

The first object of the present invention is to improve the response characteristic to a temperature change, the second object of the present invention is to enhance the productivity by reducing the height, and the third object is to effectively use a heat source when a constant temperature oscillator is provided.

As described in the scope of the claims (claim 1) for the present invention, a constant temperature crystal oscillator includes on a circuit substrate: a surface-mount crystal resonator which is provided with two crystal terminals as mount terminals and a dummy terminal, and has a metal cover; an oscillation circuit element which forms an oscillation circuit together with the crystal resonator; and a temperature control element which keeps a constant operation temperature of the crystal resonator. The temperature control element includes at least a heating chip resistor, a power transistor for supplying electric power to the chip resistor, and a temperature sensitive resistor for detecting the operation temperature of the crystal resonator. A dummy terminal on the substrate side of the circuit substrate for connection to the dummy terminal of the crystal resonator is connected to a resistor terminal on the substrate side to which the temperature sensitive resistor is connected through a conductive path (corresponding to the first through third embodiments).

With the above-mentioned configuration, the dummy terminal of the surface-mount resonator is connected to the temperature sensitive resistor through a conductive path. Therefore, the temperature of the surface-mount resonator is directly transmitted to the temperature sensitive resistor. Therefore, the electric power supplied to the heating chip resistor from the power transistor responsive in real time to the temperature change of the surface-mount resonator can be controlled. Thus, the response characteristic to the temperature change can be successfully maintained.

According to claim 2 of the present invention based on claim 1, the dummy terminal is electrically connected to the metal cover of the crystal resonator. Thus, the extraneous noise reaching the metal cover is consumed by the heating chip resistor through the dummy terminal on the substrate side, and is connected (flows into) the power supply. Therefore, the EMI (electromagnetic interference) can be suppressed by maintaining the metal cover at a constant voltage. In this case, since the dummy terminal is not connected to a grounding pattern of the circuit substrate as in the related art, the liberated heat through the grounding pattern can be suppressed (corresponding to the first through third embodiments).

According to claim 3 based on claim 1, the crystal resonator has two dummy terminals and the two crystal terminals at the four corners on the bottom. The circuit substrate has the dummy terminal on the substrate side and a crystal terminal on the substrate side to which the two crystal terminals are connected. At least one of the dummy terminal on the substrate side connected to the resistor terminal on the substrate side through a conductive path extends to at least the central area facing the bottom surface of the crystal resonator, and has a larger area than the crystal terminal (corresponding to the second embodiment).

With the according to configuration, the dummy terminal on the substrate side connected to the resistor terminal on the substrate side is formed with a large area while facing the bottom surface of the crystal resonator. Therefore, the radiant heat is absorbed from the crystal resonator. As a result, the operation temperature of the crystal resonator can be detected by the temperature sensitive resistor in real time.

According to claim 4 based on claim 3, the two dummy terminal on the substrate side is commonly connected through the conductive path (corresponding to the second embodiment). Thus, since the area of the dummy terminal on the substrate side can be further enlarged and the radiant heat can be absorbed, the operation temperature of the crystal resonator can be furthermore detected in real time.

According to claim 5 based on claim 1, the crystal resonator is arranged between the power transistor and the chip resistor, and the temperature sensitive resistor is arranged adjacent to the crystal resonator (corresponding to the first through third embodiments). Thus, the radiant heat from the power transistor can be effectively used. In this case, one heating chip resistor can be reduced from the configuration according to the related art, thereby realizing a more economical configuration.

According to claim 6 based on claim 5, the conductive path electrically connecting the power transistor to the chip resistor can be formed by traversing below the external bottom surface of the crystal resonator (corresponding to the third embodiment). In this case, the radiant heat from the conductive path electrically connecting the power transistor to the chip resistor is added to the bottom surface of the crystal resonator, thereby further effectively utilizing the heat source.

According to claim 7 based on claim 6, the conductive path is cross-shaped between the mount terminals provided at the four corners of the crystal resonator (corresponding to the third embodiment). Thus, the radiant heat can be applied to the entire bottom surface of the crystal resonator, thereby further effectively realizing the heat source.

According to claim 8 based on claim 1, the circuit substrate is a single plate and is made of a glass epoxy material (corresponding to the first through third embodiments). Thus, since the circuit substrate on which the oscillation circuit element including the surface-mount resonator and the temperature control element are arranged is a single plate, the height of the constant temperature oscillator can be reduced. In addition, it is not necessary to arrange the first and second substrates above and below using a metal pin as in the related art. Additionally, the epoxy material is less expensive than the ceramic material. Therefore, the productivity can be enhanced.

According to claim 9 based on claim 1, the crystal resonator, the power transistor, the heating chip resistor, and the temperature sensitive resistor are covered with a thermal conductivity resin (corresponding to the first through third embodiments). Thus, the thermal conductivity among the crystal resonator, the power transistor, the chip resistor, and the temperature sensitive resistor can be enhanced. Especially, the temperature between the surface-mount resonator and the temperature sensitive resistor can be leveled. Since the heat from the power transistor and the heating chip resistor is transmitted to the surface-mount resonator, the response characteristic to a temperature change can be further improved.

According to claim 10 based on claim 1, the circuit substrate is held by the airtight terminal of the metal base. The crystal resonator, the heating chip resistor, the power transistor, and the temperature sensitive resistor are arranged below the bottom surface of the circuit substrate facing the metal base. The oscillation circuit element and the control element in the temperature control element are arranged on the top surface of the circuit substrate (according to the first through third embodiments). Thus, for example, the controlling operation of the control element before covering the metal base can be more easily performed.

BRIEF DESCRIPTION OF THE DRAWINGS

FIG. 1 is an explanatory view of the related art in which

FIG. 2 is an explanatory view of the surface-mount resonator in which

FIG. 3 is an explanatory view of the related art in which

FIG. 4 is an explanatory view of the first embodiment of the present invention in which

FIG. 5 is an explanatory view of the second embodiment of the present invention in which

DESCRIPTION OF THE PREFERRED EMBODIMENT

First Embodiment

Figure 4A:
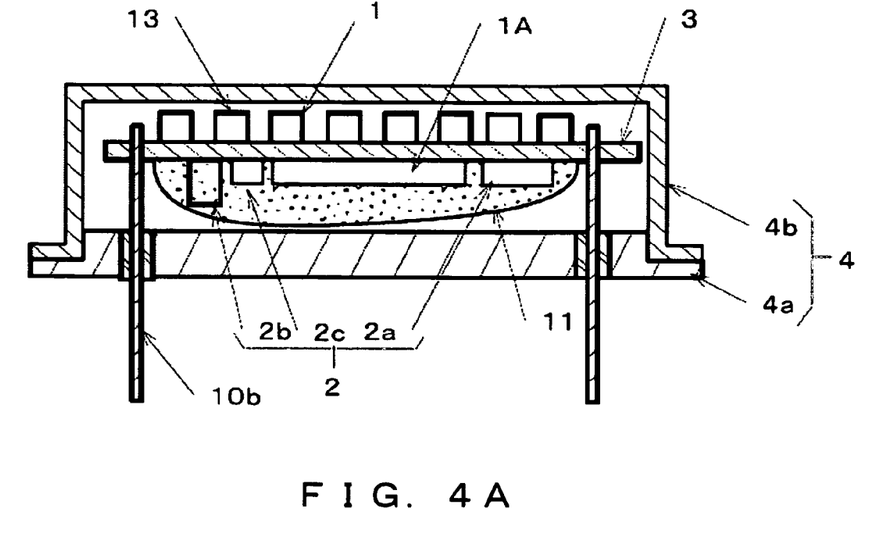
FIG. 4A is a sectional view of the constant temperature oscillator.
Figure 4B:
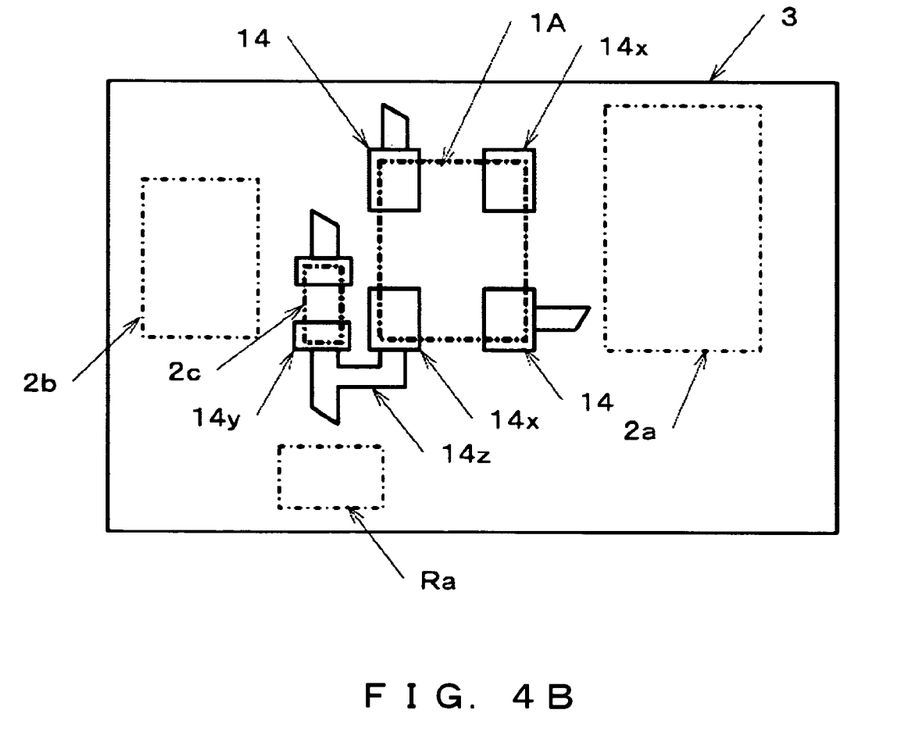
FIG. 4B is a plan view of the circuit substrate.

FIG. 4 is an explanatory view of the first embodiment of the present invention in which FIG. 4A is a sectional view of the constant temperature oscillator, and FIG. 4B is a plan view of the circuit substrate. The explanation of the same components of the related art is simply described or omitted here.

As described above, the constant temperature oscillator arranges on the circuit substrate 3 the existing surface-mount resonator 1A, the oscillation circuit element 1 forming an oscillation circuit with the resonator, and the temperature control element 2 for leveling the operation temperature by including at least the heating chip resistor 2a, the power transistor 2b, and the temperature sensitive resistor 2c. These components-are airtightly sealed in the metal container 4. In this example, the circuit substrate 3 is a single plate (single substrate) made of a glass epoxy material, and the bottom surface of the circuit substrate 3 faces the metal base 4a. The circuit substrate is a single plate, but it also can be a layered substrate.

On the top surface of the circuit substrate 3, the oscillation circuit element 1 excluding the surface-mount resonator 1A is arranged, and on the bottom surface, the surface-mount resonator 1A and the temperature control element 2 are arranged. The surface-mount resonator 1A is arranged at the central portion of the circuit substrate 3 with the heating chip resistor 2a and the power transistor 2b of the temperature control element 2 placed on the respective sides of the surface-mount resonator 1A. Then, the temperature sensitive resistor 2c having the smallest planar shape formed by a thermistor is arranged between the surface-mount resonator 1A and, for example, the power transistor 2b. The surface-mount resonator 1A and the temperature control element 2 are covered with the thermal conductive resin 11. The thermal conductive resin 11 is based on silicon as described above, and is about 100 times as thermal-conductive as air.

Among substrate-side terminals 14 of the circuit substrate 3 in which the surface-mount resonator 1A and the temperature control elements 2 (chip resistor 2a, power transistor 2b, and temperature sensitive resistor 2c) are fixed by soldering, etc., a substrate-side dummy terminal 14x connected to one of the above-mentioned dummy terminals 9b of the surface-mount resonator 1A is commonly connected by a substrate-side resistor terminal 14y and a conductive path 14z connected to one of the mount terminals (not shown in the attached drawings) of the temperature sensitive resistor 2c, and has the same potential (voltage dividing power supply voltage) as one mount terminal 14y of the temperature sensitive resistor 2c The wiring pattern not shown in the attached drawings including the substrate-side dummy terminal 14x, the substrate-side resistor terminal 14y, and the conductive path 14z is formed by the materials more excellent in thermal conductivity than the ceramic material, for example, Au and Cu. The other terminal of the substrate-side dummy terminal 14x is not connected to the grounding pattern of the set substrate but terminated (electrically open terminal).

In this example, as described above, after setting the circuit substrate 3 to the metal base 4a, the frequency temperature characteristic of the surface-mount resonator 1A is individually measured. Depending on the minimum value of the frequency temperature characteristic, the resistor Ra of the temperature control circuit is controlled, and the surface-mount resonator 1A is set to the temperature of the minimum value, for example, 80° C. The control capacitor allows the oscillation frequency f to match the nominal frequency. In this case, the control elements 13 such as the resistor Ra, control capacitor, etc. are arranged on the top surface of the circuit substrate 3.

With the above-mentioned configuration, as explained in Summary of the Invention, since the dummy terminal 9b of the surface-mount resonator 1A is connected to the mount terminal of the temperature sensitive resistor 2c through the conductive path 14z, the temperature (heat) of the surface-mount resonator 1A is directly conducted to the temperature sensitive resistor 2c. Therefore, the temperature sensitive resistor 2c responds to the temperature change of the surface-mount resonator 1A in real time, thereby correctly controlling the power supplied from the power transistor 2b to the heating chip resistor 2a. Thus, the response characteristic to a temperature change can be correctly maintained.

Additionally, since the oscillation circuit element including the surface-mount resonator 1A and the temperature control element 2 are arranged on the circuit substrate 3 as a single plate, the height of the constant temperature oscillator can be reduced in simple production. Since the circuit substrate 3 is simply made of a glass epoxy single plate, it is less expensive than a ceramic plate, and has improved productivity.

The surface-mount resonator 1A is arranged between the heating chip resistor 2a and the power transistor 2b, and the temperature sensitive resistor 2c is arranged adjacent to the surface-mount resonator 1A. Therefore, the liberated heat from the power transistor 2b can be effectively used. In this example, one heating chip resistor 2a can be reduced and more economical than the related art.

The surface-mount resonator 1A and the temperature control element 2 (chip resistor 2a, power transistor 2b, and temperature sensitive resistor 2c) are covered with the thermal conductive resin 11. Thus, the thermal conductivity can be enhanced between the surface-mount resonator 1A and the temperature control element 2. Especially, the temperatures of the surface-mount resonator 1A and the temperature sensitive resistor 2c can be leveled. Then, since the heat from the power transistor 2b and the heating chip resistor 2a can be conducted to the surface-mount resonator 1A by the thermal conductive resin 11, the response characteristic to a temperature change can be further improved.

Furthermore, since the resistor Ra of the temperature control circuit and the control elements 13 such as the control capacitor, etc. of the oscillation circuit are arranged on the top surface of the circuit substrate 3, the controlling operations (exchange, etc.) can be easily performed. Since the arrangement can be made on any part of the top surface, the arranging design can be freely determined without restrictions.

The other end of the substrate-side dummy terminal 14x is not connected to the grounding pattern and terminated. Therefore, the heat is prevented from being liberated through the grounding pattern and the airtight terminal 10b, the thermal efficiency can be improved. In this case, the substrate-side dummy terminal 14x electrically connected to the metal cover 8 of the surface-mount resonator 1A is connected to the power supply voltage through the temperature sensitive resistor 2c. Therefore, although extraneous noise reaches the metal cover 8, the extraneous noise is consumed by the temperature sensitive resistor 2c and absorbed by the power supply voltage, and the substrate-side dummy terminal 14x is maintained to be equal to the other terminal for a constant voltage of the same potential (direct current voltage). Thus, the EMI, etc. can be avoided.

Second Embodiment

Figure 5A:
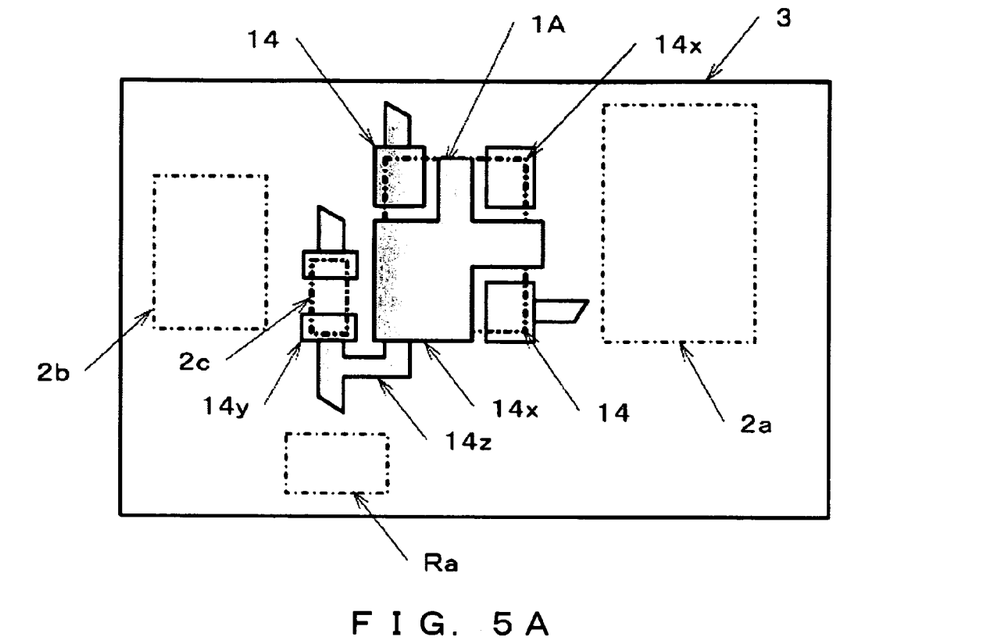
FIGS. 5A and 5B are plan views of the circuit substrate of the constant temperature oscillator.
Figure 5B:
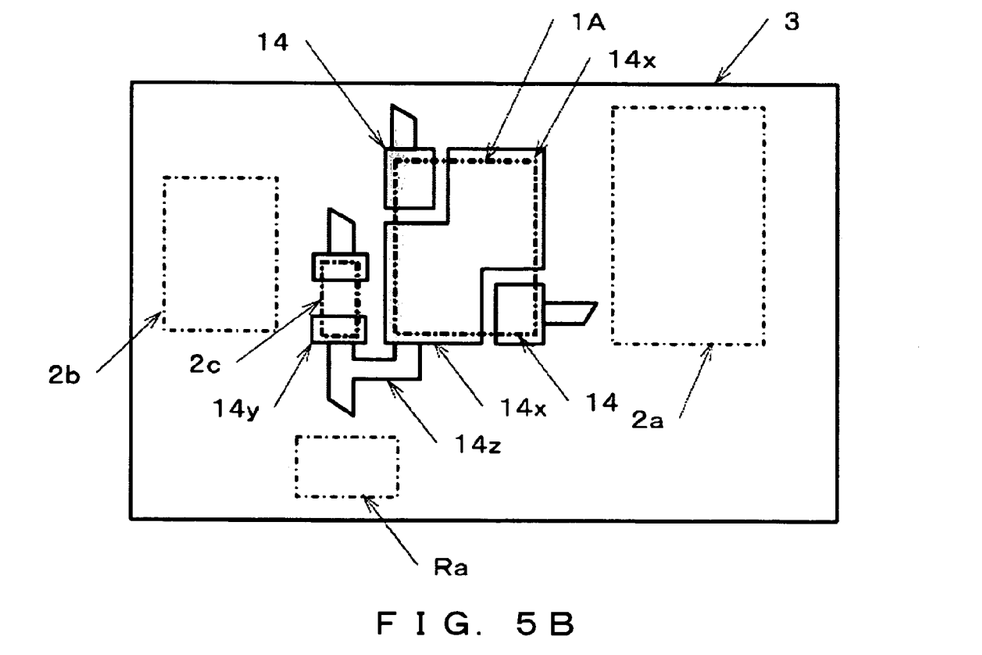

FIGS. 5A and 5B are explanatory views of the second embodiment of the present invention, and are plan views of the circuit substrate of the constant temperature oscillator. The same components between the embodiment and the related art are assigned the same reference numerals, and the detailed explanation is simplified or omitted here.

According to the second embodiment shown in, for example, FIG. 5A, the substrate-side dummy terminal 14x connected to one of the dummy terminals 9b of the surface-mount resonator 1A extends at least to the central area facing the bottom surface of the surface-mount resonator 1A. For example, it also extends between the substrate-side crystal terminal 14 of a set of diagonal portions and the substrate-side dummy terminal 14x of the other set of diagonal portions. In FIG. 5B, one of the diagonal portion of the other set is commonly connected to the other substrate-side dummy terminal 14x. Thus, one of the substrate-side dummy terminal 14x becomes larger in area than the crystal terminal on the substrate side.

With the above-mentioned configuration, one of the substrate-side dummy terminal 14x totally faces the bottom surface of the surface-mount resonator 1A including the case where it is commonly connected to the other terminal of the substrate-side dummy terminal 14x. Therefore, the liberated heat of the surface-mount resonator 1A is totally absorbed and conducted to the substrate-side resonator terminal 14y of the temperature sensitive resistor 2c. Thus, the operation temperature of the surface-mount resonator can be detected in real time, and the response characteristic to the temperature of the surface-mount resonator can be furthermore enhanced.

Third Embodiment

Figure 6:
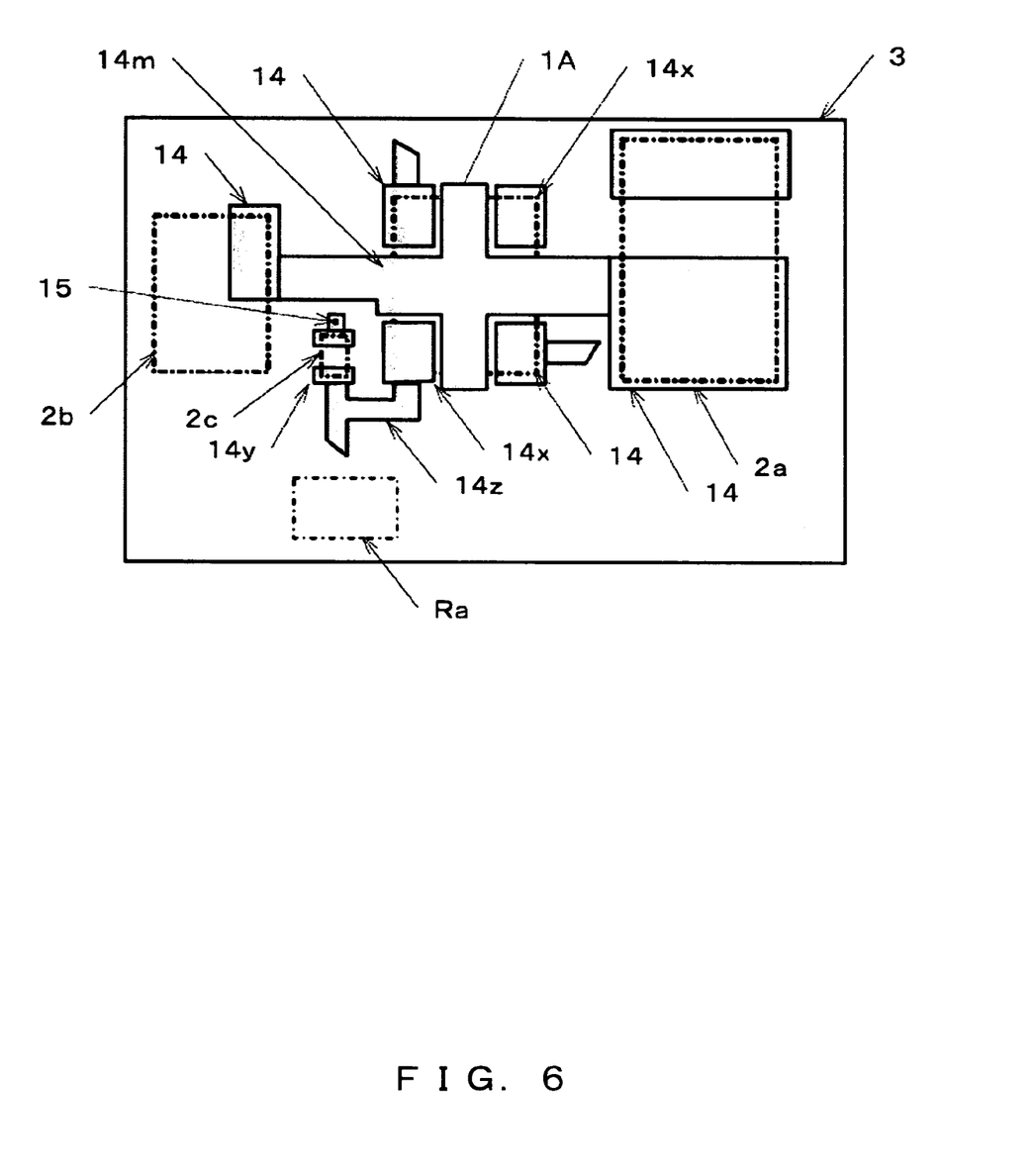
FIG. 6 is an explanatory view of the third embodiment of the present invention, and is a plan view of the circuit substrate of the constant temperature oscillator.

FIG. 6 is an explanatory view of the third embodiment of the present invention, and is a plan view of the circuit substrate of the constant temperature oscillator. The same components between the embodiment and the related art are assigned the same reference numerals, and the detailed explanation is simplified or omitted here.

In the third embodiment, the substrate-side dummy terminal 14x of the surface-mount resonator 1A is connected to the substrate-side resistor terminal 14y of the temperature sensitive resistor 2c as in the first embodiment through the conductive path 14z. In this example, the heating chip resistor 2a and the power transistor 2b arranged on both sides of the surface-mount resonator 1A are thermally connected. That is, the heating chip resistor 2a and the power transistor 2b are electrically connected (refer to FIG. 3A).

In this example, the substrate-side terminal 14 to which the chip resistor 2a and the power transistor 2b are fixed is connected by a conductive path 14m traversing the external bottom surface of the surface-mount resonator 1A. For example, the conductive path below the external bottom surface of the surface-mount resonator 1A is cross-shaped. The other end of the mount terminal of the temperature sensitive resistor is connected to the conductive path of another main surface or the layered surface of the circuit substrate 3 through a via hole 15. It is obvious that the configuration can also be applied to the first and second embodiments.

With the configuration, as in the first embodiment, the operation temperature of the surface-mount resonator 1A is detected by the conductive path 14z in real time to improve the response characteristic of the temperature (heat) control for the surface-mount resonator. In this example, the conductive path 14m which electrically connects the heating chip resistor 2a to the power transistor 2b traverses the external bottom surface of the surface-mount resonator 1A and fully extends. Therefore, the radiant heat from the conductive path 14m is applied from the external bottom surface of the surface-mount resonator 1A. Thus, the heat source can be further effectively used.

In the above-mentioned embodiment, the surface-mount resonator 1A has the crystal terminals 9a at one set of diagonal portions and the dummy terminals 9b at the other set of diagonal portions. These arrangements are optionally made. That is, at least one dummy terminal 9b has to be connected to the temperature sensitive resistor 2c. In addition, the dummy terminal 9b is described as a grounding terminal connected to the metal cover 8, but can be electrically independent as the dummy terminal 9b according to the present invention.

Additionally, the dummy terminals 14x of the other diagonal portions of the surface-mount resonator 1A are connected by the metal cover 4b, and the other dummy terminal 14x is terminated, but only the other dummy terminal 14x can be connected to the metal cover 4b for connection to the grounding pattern. However, in this case, since a new surface-mount resonator 1A is developed, each embodiment to which an existing product can be applied is more practical. Furthermore, the metal container 4 is resistance-welded, but other methods can be used. However, since a airtight seal structure is designed for the resistance welding, for example, an aging characteristic can be improved.

What is claimed is:

1. A constant temperature crystal oscillator, comprising on a circuit substrate: a surface-mount crystal resonator which is provided with two crystal terminals as mount terminals and a first dummy terminal on a bottom surface, and has a metal cover; an oscillation circuit element which forms an oscillation circuit together with the crystal resonator; and a temperature control element which keeps a constant operation temperature of the crystal resonator, in which the temperature control element comprises at least a heating chip resistor, a power transistor for supplying electric power to the chip resistor, and a temperature sensitive resistor for detecting the operation temperature of the crystal resonator, wherein
a second dummy terminal on a substrate side of the circuit substrate for connection to the first dummy terminal of the crystal resonator is connected to a resistor terminal on the substrate side to which the temperature sensitive resistor is connected through a thermally conductive path.

2. The constant temperature crystal oscillator according to claim 1, wherein the second dummy terminal is electrically connected to the metal cover of the crystal resonator.

3. The constant temperature crystal oscillator according to claim 1, wherein the crystal resonator has two first dummy terminals and the two crystal terminals at four corners on the bottom; the circuit substrate has the second dummy terminal on the substrate side and a crystal terminal on the substrate side to which the two crystal terminals are connected; at least one of the first dummy terminals on the substrate side connected to the resistor terminal on the substrate side through the conductive path extends to at least a central area facing the bottom surface of the crystal resonator, and has a larger area than the crystal terminal.

4. The constant temperature crystal oscillator according to claim 3, wherein the two first dummy terminals on the substrate side are commonly connected by the conductive path.

5. The constant temperature crystal oscillator according to claim 1, wherein the crystal resonator is arranged between the power transistor and the chip resistor, and the temperature sensitive resistor is arranged adjacent to the crystal resonator.

6. The constant temperature crystal oscillator according to claim 5, wherein the conductive path, which connects the power transistor to the chip resistor, traverses an external bottom surface of the crystal resonator.

7. The constant temperature crystal oscillator according to claim 6, wherein the conductive path is cross-shaped between mount terminals provided at four diagonal portions of the crystal resonator.

8. The constant temperature crystal oscillator according to claim 1, wherein the circuit substrate is a single plate of a glass epoxy material.

9. The constant temperature crystal oscillator according to claim 1, wherein the crystal resonator, the power transistor, the heating chip resistor, and the temperature sensitive resistor are covered with a thermal conductive resin.

10. The constant temperature crystal oscillator according to claim 1, wherein
the circuit substrate is held by an airtight terminal of a metal base;
the crystal resonator, the heating chip resistor, the power transistor, and the temperature sensitive resistor are arranged below a bottom surface of the circuit substrate facing the metal base; and
the oscillation circuit element and the control element in the temperature control element are arranged on a top surface of the circuit substrate.

11. A constant temperature crystal oscillator, comprising:
a circuit substrate including a first side and a second side;
an oscillation circuit element on a first side of the circuit substrate;
a surface-mount crystal resonator on a second side of the circuit substrate, the crystal resonator including a plurality of crystal terminals and at least one dummy terminal;
a container enclosing the circuit substrate, oscillation circuit element, and crystal resonator;
a temperature control element to keep a constant operation temperature of the crystal resonator, the temperature control element comprising at least a heating chip resistor, a power transistor for supplying electric power to the chip resistor, and a temperature sensitive resistor for detecting the operation temperature of the crystal resonator, the temperature sensitive resistor including a terminal; and
a thermally conductive path connecting the dummy terminal to the terminal of the temperature sensitive resistor.

12. The constant temperature crystal oscillator of claim 11, wherein the temperature sensitive resistor is to sense temperature of the surface-mount crystal resonator through the conductive path and dummy terminal.

13. The constant temperature crystal oscillator of claim 12, wherein the dummy terminal is on a side of the crystal resonator remote from the circuit substrate.

14. The constant temperature crystal oscillator of claim 13, wherein the dummy terminal, the conductive path, and terminal of the temperature sensitive resistor are more thermally conductive than ceramic material.

15. The constant temperature crystal oscillator of claim 14, wherein the dummy terminal is electrically floating.

16. The constant temperature crystal oscillator of claim 12, wherein the crystal resonator is arranged between the power transistor and the chip resistor, and wherein the temperature sensitive resistor is arranged adjacent to the crystal resonator.

17. The constant temperature crystal oscillator according to claim 16, wherein the conductive path, which connects the power transistor to the chip resistor, traverses an external bottom surface of the crystal resonator.

18. The constant temperature crystal oscillator according to claim 17, wherein the conductive path is cross-shaped between mount terminals provided at four diagonal portions of the crystal resonator.

19. The constant temperature crystal oscillator according to claim 14, wherein the circuit substrate is a single plate of a glass epoxy material, and wherein the crystal resonator, the power transistor, the heating chip resistor, and the temperature sensitive resistor are each covered with a thermal conductive resin.

20. The constant temperature crystal oscillator according to claim 11, wherein the circuit substrate is held by an airtight terminal of a metal base;

the first side of the circuit substrate is a top surface;

the second side of the circuit substrate is a bottom surface;

the crystal resonator, the heating chip resistor, the power transistor, and the temperature sensitive resistor are arranged below the bottom, first surface of the circuit substrate facing the metal base; and the oscillation circuit element and the control element in the temperature control element are arranged on the top, second surface of the circuit substrate.

* * * * *